United States Patent [19]

Sasaki et al.

[11] Patent Number: 5,745,057
[45] Date of Patent: Apr. 28, 1998

[54] ADJUSTMENT OPERATING APPARATUS

[75] Inventors: Makoto Sasaki; Akira Shinada, both of Kanagawa, Japan

[73] Assignee: Sony Corporation, Tokyo, Japan

[21] Appl. No.: 710,945

[22] Filed: Sep. 24, 1996

[30] Foreign Application Priority Data

Sep. 25, 1995 [JP] Japan ................................. 7-270614

[51] Int. Cl.6 .................................................... H03M 11/00
[52] U.S. Cl. ................................. 341/35; 341/13; 200/24; 381/109
[58] Field of Search .................... 341/13, 35; 345/184, 345/167; 381/104, 109; 250/231.14; 200/24

[56] References Cited

U.S. PATENT DOCUMENTS

| | | | |
|---|---|---|---|
| 4,387,374 | 6/1983 | Wiener | 341/35 |
| 5,086,221 | 2/1992 | Ishihara | 341/13 |
| 5,189,355 | 2/1993 | Larkins | 250/231.14 |
| 5,366,346 | 11/1994 | Danby | 341/35 |
| 5,541,406 | 7/1996 | Waynik | 250/231.14 |

*Primary Examiner*—Thomas Mullen
*Assistant Examiner*—Albert K. Wong
*Attorney, Agent, or Firm*—Jay H. Maioli

[57] ABSTRACT

An adjustment operating apparatus for adjusting an adjusting object, such as sound volume, through an operation by the user which includes an operation device for adjusting an adjusting object so as to increase or decrease through an operation and for inputting an adjustment change amount proportional to the amount of the operation, and a control device for generating an adjustment control signal for adjusting and controlling the adjusting object in response to a signal in accordance with the operation from the operation device, wherein the control device varies the speed of change in which the adjustment change amount is increased from the speed of change in which the adjustment change amount is decreased, making it easy to perform a sound volume adjustment operation.

3 Claims, 4 Drawing Sheets

ADJUSTMENT OPERATING APPARATUS

BACKGROUND OF THE INVENTION

1. Field of the Invention

The present invention relates to an adjustment operating apparatus which can be suitably used for adjusting, for example, sound volume.

2. Description of the Related Art

As an apparatus for adjusting the sound volume of a television receiver, an audio apparatus or the like, there is an apparatus using a pulse encoder. In a case where this apparatus uses, for example, a rotary pulse encoder, a rotary knob is mounted in axial alignment with the rotary shaft of a rotating element which constitutes the rotary pulse encoder. When the user rotates the rotary knob, the number of pulses proportional to the number of rotations are generated from the pulse encoder. At this time, the pulse encoder also outputs information indicating the direction of the operation, namely, in this case, the direction of the rotation, and supplies the information together with an output pulse to a microcomputer for generating an adjustment signal.

The microcomputer determines the direction of the adjustment on the basis of the information indicating the direction of the rotation from the pulse encoder and supplies the unit change amount per one pulse as an adjustment signal for the above-described determined adjustment direction to an adjusting object each time a pulse is received from the pulse encoder.

When, for example, the adjusting object is sound volume, each time one pulse is received from the pulse encoder, a sound volume adjustment signal of a unit sound volume change amount for increasing or decreasing sound volume is supplied to a sound volume adjustment control according to the information for the direction of the rotation of the rotary knob by the user. Then, pulses are generated from the pulse encoder by an amount corresponding to the number of rotations of the rotary knob operated by the user. Thus, the sound volume is changed and adjusted by an amount corresponding to the amount of the rotational operation by the user.

Meanwhile, in order to improve the correspondence of the operation speed (the rotational operation speed) of the rotary knob by the user with the adjustment change amount, for example, the change of the sound volume, hitherto, the microcomputer determines the operation speed of the rotary knob by the user by measuring the cycle of pulses from the pulse encoder and changes the unit change amount per one pulse according to the operation speed of the user. When, for example, the rotational operation speed performed by the rotary knob by the user is high, the unit change amount is increased so that the change in the adjustment change amount corresponds to the operation by the user.

The pulse encoder is broadly formed of a rotation mechanism section and a sensor section in order that pulses are generated in response to rotation. As pulse encoders, there are optical-type pulse encoders, magnetic-type pulse encoders, and mechanical-type pulse encoders. Generally speaking, the pulse encoder, depending upon its performance, generates only a number of pulses smaller than the number of pulses to be theoretically generated from the sensor when the rotational speed of the rotation mechanism section exceeds a predetermined value.

In particular, in the case of a mechanical-type pulse encoder, because of its mechanical construction, when the rotational speed of the rotating element becomes high, the number of output pulses becomes only a fraction of the number of pulses which should be actually generated from the sensor.

As an example of a mechanical-type encoder, there is a mechanical-type encoder of the type in which pulses are output from the sensor by providing a plurality of projections and recesses on the rotary peripheral surface of a rotary plate and a mechanical sensor so as to face the rotary peripheral surface of the rotary plate and by then detecting the contact between the contact element of this mechanical sensor and the projection portions of the projections and recesses of the rotary plate. In such a case, because of its mechanical construction, when the rotational speed of the rotary plate becomes high, the projection portions of the rotary plate discretely contact the contact element of the sensor, and thus the number of pulses output from the sensor does not accurately correspond to the number of projection portions of the rotary plate.

Therefore, it is difficult to make adjustments using such pulse encoder by making the adjustment change amount linearly correspond to the rotational operation speed performed by the user.

For this reason, when, for example, the above-described adjustment operation is used as a sound volume adjustment operation, even if the rotary knob is rotated at a high speed by trying to decrease the sound volume rapidly with the intention of muting, a phenomenon may occur in which the sound volume does not become sufficiently small.

Therefore, in order to attain a sufficiently large adjustment change amount during high-speed rotation of the rotary knob, it is conceivable to increase the unit change amount per one pulse. In such a case, since there occurs the same change in the increase of the sound volume, problems arise, for example, the sound volume suddenly becomes too high, surprising the user or sometimes damaging the user's ear. As described above, since the unit change amount during high-speed rotation of the rotary knob cannot be increased, hitherto, a key button provided specially for muting is separately required to decrease the sound volume quickly and sufficiently.

However, in the case of an audio apparatus installed in a motor vehicle, the space where the operation knob is provided is small. When the safety relating to the operation by the driver is taken into consideration, preferably the lesser the number of operation knobs, and separately providing a muting key is preferably avoided to the extent possible.

SUMMARY OF THE INVENTION

In view of the above points, it is an object of the present invention to provide an adjustment operating apparatus capable of performing adjustments to an adjusting object with as high a degree of ease of operation as the user desires whereby a desirable adjustment change amount is different depending upon the direction of adjustment.

To achieve the above-described object, according to the present invention there is provided an adjustment operating apparatus, comprising: operation means for adjusting an adjusting object so as to increase or decrease through an operation by the user and for inputting an adjustment change amount in proportion to the amount of operation by the user; and control means for generating an adjustment control signal for adjusting and controlling an adjusting object in response to a signal corresponding to an operation input from the operation means, wherein the control means varies the speed of change in the increase of the adjusting object from the speed of change in the decrease of the adjusting object according to the operation of the operation means by the user.

When, for example, an adjustment operating apparatus is a sound volume adjustment operating apparatus, it is possible to increase the amount of change of the sound volume in which the sound volume is decreased more than the amount of change of the sound volume in which the sound volume is increased. If an adjustment is made to decrease the sound volume at a high speed with the intention of muting, the sound volume can be decreased at a high speed in accordance with the operation, and since the amount of change of the sound volume in which the sound volume is increased is small, an inconvenience such that the sound volume becomes suddenly high by the user operation can be avoided.

The above and further objects, aspects and novel features of the invention will become more apparent from the following detailed description when read in connection with the accompanying drawings.

DESCRIPTION OF THE PREFERRED EMBODIMENTS

A case in which a first embodiment of an adjustment operating apparatus of the present invention is applied to a sound volume adjustment operating apparatus of an audio preamplifier installed in a motor vehicle will now be described below with reference to FIGS. 1 to 4.

Figure 1:
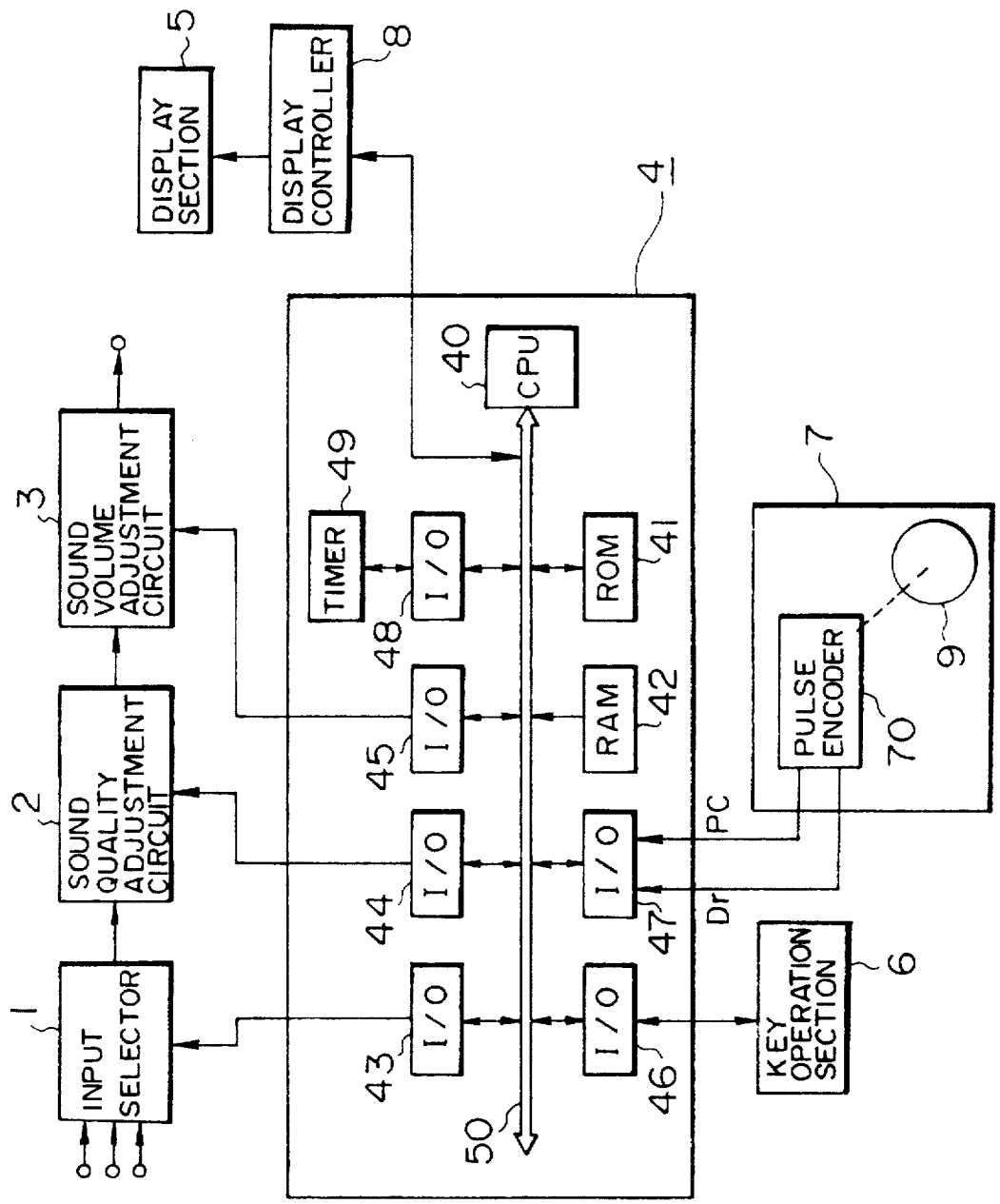
FIG. 1 is a block diagram illustrating a first embodiment of an adjustment operating apparatus according to the present invention.
Figure 2:
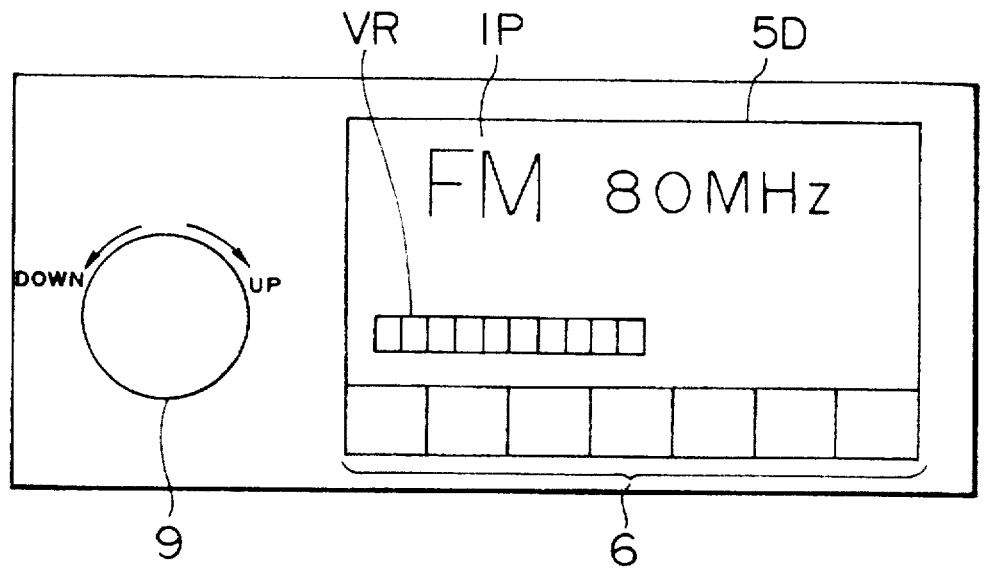
FIG. 2 shows the embodiment of FIG. 1.

FIG. 1 is a block diagram illustrating the construction of the adjustment operating apparatus according to this embodiment. FIG. 2 shows the front panel thereof.

As shown in FIG. 1, the preamplifier of this embodiment comprises an input selector 1, a sound quality adjusting circuit 2, a sound volume adjusting circuit 3, a control circuit 4, a display section 5, a key operation section 6, and a sound volume adjustment operation section 7.

The control circuit 4 is formed of a microcomputer comprising a CPU 40, a program ROM 41, a RAM 42 for use as a work area, and I/O ports 43 to 48. Reference numeral 50 denotes a system bus. In the case of this example, a timer circuit 49 is provided, which is connected to the system bus 50 through the I/O port 48.

The key operation section 6, as shown in FIG. 2, is provided with various keys, such as a key for adjusting the sound quality and a key for selecting an audio input source, which keys are provided on the front panel of this preamplifier. A key operation signal by the user from the key operation section 6 is input to the control circuit 4 through the I/O port 46. The control circuit 4 decodes the key operation signal and generates a control signal in accordance with the key operation, and supplies the control signal to necessary portions.

The input selector 1 selects the input source selected by the user via the key operation section 6 from among, for example, an AM/FM/TV tuner, a tape recorder and a CD player, which are connected as audio input sources of this preamplifier. Receiving the selection specification via the key operation section 6 by the user, the control circuit 4 generates an input source selection signal in accordance with the selection specification and supplies the signal to the input selector 1 through the I/O port 43. The input selector 1 selects the input source in accordance with the selection signal and outputs it.

The sound quality adjusting circuit 2 adjusts and controls the sound quality of an audio signal from the input selector 1 in accordance with a sound quality adjusting signal from the control circuit 4. The control circuit 4 generates a signal for adjusting sound quality in accordance with the key operation and supplies the generated sound quality adjusting signal to the sound quality adjusting circuit 2 through the I/O port 44.

The sound volume adjusting circuit 3 is provided with a volume control for adjusting the sound volume, for example, an electronic volume, and adjusts the sound volume by adjusting the level of the audio signal from the sound quality adjusting circuit 2 in accordance with the sound volume adjustment signal from the control circuit 4. The control circuit 4 generates a sound volume adjustment signal from a pulse PC and a rotational direction signal Dr from the sound volume adjustment operation section 7, as will be described later, and supplies the signal to the sound volume adjusting circuit 3 through the I/O port 45. The sound volume adjusted signal is output to, for example, a power amplifier.

The display section 5 is formed of, for example, an LCD (liquid-crystal display) and has a display screen 5D shown in FIG. 2. The control circuit 4 supplies display data to the display section 5 via a display controller 8. The display controller 8 makes various displays, such as an input source display IP and a sound volume display using a bar display VR shown in FIG. 2, on the display screen 5D in accordance with the display program thereof.

Figure 3:
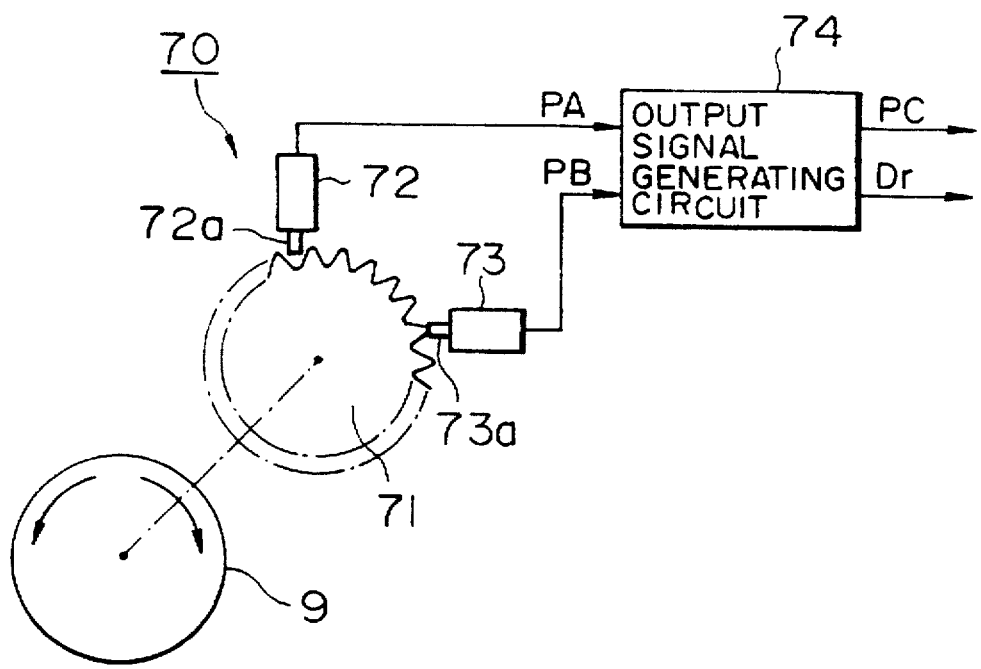
FIG. 3 shows an example of a pulse encoder for use in the embodiment of FIG. 1.

In this embodiment, the sound volume adjustment operation section 7 is formed of a mechanical-type pulse encoder 70 and a rotary knob 9 provided on the front panel of the preamplifier so as for the user to be able to rotate the rotary knob, as shown in FIG. 2. The rotary knob 9, as shown in FIG. 3, is mounted in axial alignment with the rotary shaft of a rotary plate 71 which constitutes a pulse encoder 70. In the example shown in the figure, it is assumed that the direction in which the rotary knob 9 is rotated clockwise is a direction in which the sound volume is increased, and that the direction in which the rotary knob 9 is rotated counterclockwise is a direction in which the sound volume is decreased. In the example shown in the figure, the characters "UP" and "DOWN" indicate the direction in which the sound volume is adjusted and are provided by printing or the like in the vicinity of the rotary knob 9.

As shown in FIG. 3, the pulse encoder 70 comprises the rotary plate 71, mechanical sensors 72 and 73 formed of push switches, and an output signal generating circuit 74. A plurality of projections and recesses are provided on the rotary peripheral surface of the rotary plate 71, and the sensors 72 and 73 are provided so as to face the rotary peripheral surface of the rotary plate 71. When the contact between the respective contact elements 72a and 73a of the sensors 72 and 73 and the projection portion of the projections and recesses of the rotary plate 71 is detected, output pulses PA and PB are output from the sensors 72 and 73, respectively.

In this case, the sensors 72 and 73 are arranged in such a way that the output pulse PA and the output pulse PB are 90 degrees out of phase from each other. The output pulses PA and PB of the sensor 72 and 73 are supplied to the output signal generating circuit 74, and one of the pulses is output as an encoder output pulse PC.

In the output signal generating circuit 74, the direction of rotation of the rotary plate 71, hence, the rotary knob 9, is detected on the basis of the relation of the lead phase and the delay phase between the output pulses PA and PB, and a rotational direction signal Dr which is a binary signal in accordance with the direction of rotation, for example, "1" for the clockwise direction and "0" for the counterclockwise direction, is output from the output signal generating circuit 74.

The pulse PC and the rotational direction signal Dr from the sound volume adjustment operation section 6 are input to the control circuit 4 through the I/O port 45.

The control circuit 4 determines whether the rotation is in a direction in which the sound volume is increased or decreased on the basis of the rotational direction signal Dr. The control circuit 4 also detects the rotational operation speed of the rotary knob 9 by the user by measuring the cycle τ of the pulse PC. This cycle detection can be performed by counting the clock of a fixed frequency sufficiently higher than that of the pulse PC, for example, between adjacent two pulses. This is the same as that in which each time the pulse PC is input, the timer 49 is activated, and the timer time which elapses until the next pulse is input is measured.

In this embodiment, the control circuit 4 determines that the rotary knob 9 is rotated at a high speed by the user when the interval of pulses PC is a predetermined time length, for example, 50 msec or less on the basis of the measured value of the pulse interval for the above-described cycle measurement and generates a sound volume adjustment signal so as to change the sound volume change speed between the direction in which the sound volume is increased and the direction in which the sound volume is decreased. The changing of the sound volume change speed is performed by varying the sound volume change amount per one pulse between the direction in which the sound volume is increased and the direction in which the sound volume is decreased.

Figure 4:
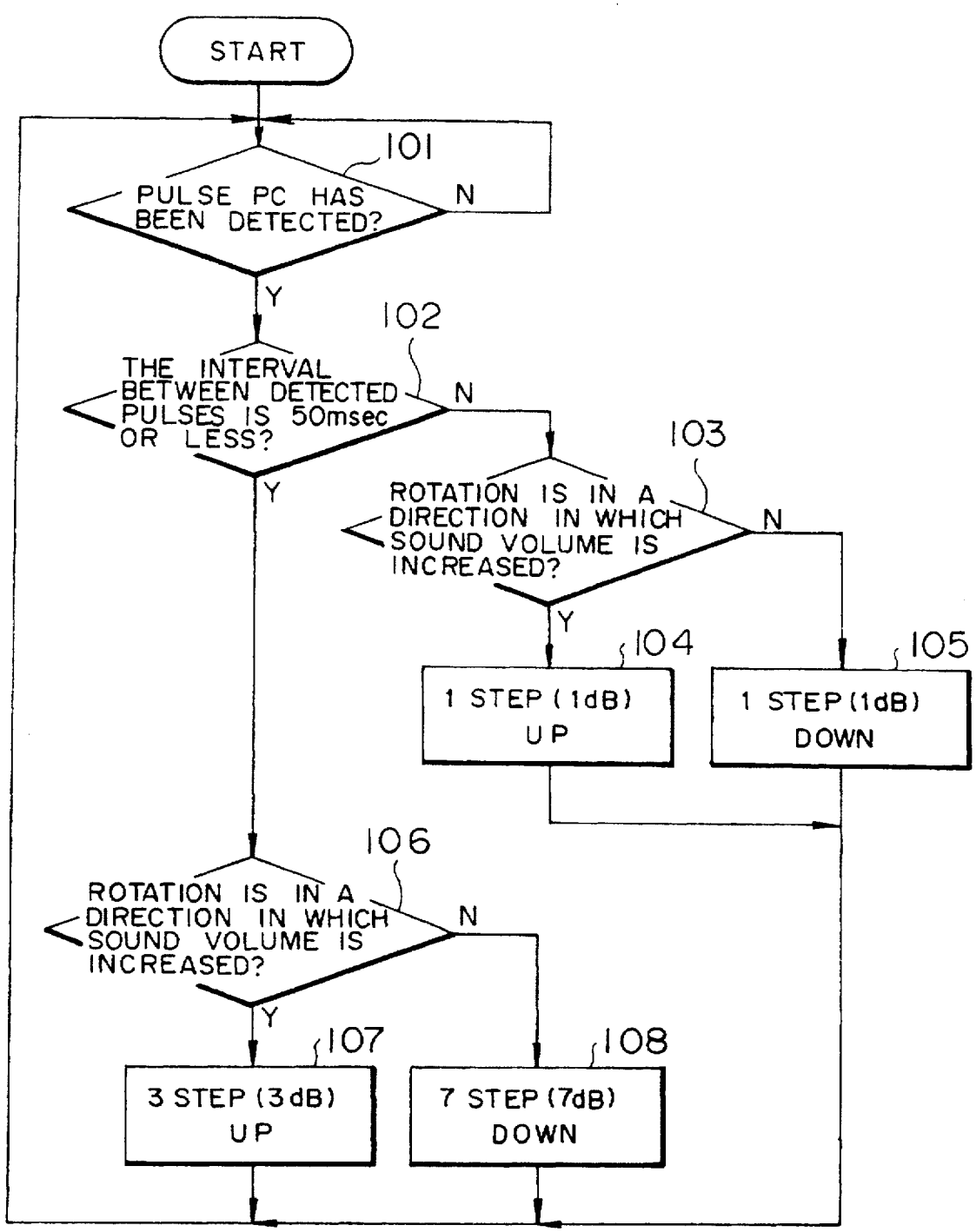
FIG. 4 is a flowchart illustrating the processing of the essential portion of the first embodiment of the adjustment operating apparatus according to the present invention.

FIG. 4 is a flowchart illustrating an example of a routine for generating and outputting a sound volume adjustment signal in the control circuit 4.

In step S101, the control circuit constantly searches to detect a pulse PC produced by the operation for rotating the rotary knob 9. When the pulse PC is detected, the process proceeds to step S102 where a check is made to determine if the measured pulse interval between the previously received pulse PC and the pulse PC received for this time is 50 msec or less.

When it is determined in step S102 that the pulse interval is 50 msec or more, it is determined that the rotation of the rotary knob 9 is not a high-speed rotation, and the process proceeds to step S103 where a check is made to determine if the rotation of the rotary knob 9 is in a direction in which the sound volume is increased or decreased on the basis of the rotational direction signal Dr.

When it is determined in step S103 that the rotation of the rotary knob 9 is in a direction in which the sound volume is increased, the process proceeds to step S104 where a sound volume adjustment signal for increasing the sound volume by a unit sound volume change amount [in this embodiment, this is a minimum unit sound volume change amount (a sound volume change amount for one step) Min] at a normal time is generated and supplied to the sound volume adjusting circuit 3 through the I/O port 44 so that the sound volume is increased by one step (1 dB in this example). Thereafter, the process returns to step S101 where waiting for the arrival of the next pulse PC is done.

When it is determined in step S103 that the rotation of the rotary knob 9 is in a direction in which the sound volume is decreased, the process proceeds to step S105 where a sound volume adjustment signal for decreasing the sound volume by the minimum unit sound volume change amount Min is generated and supplied to the sound volume adjusting circuit 3 through the I/O port 44 so that the sound volume is decreased by one step (1 dB in this example). Thereafter, the process returns to step S101 where waiting for the arrival of the next pulse PC is done.

When it is determined in step S102 that the pulse interval is 50 msec or less, it is determined that the rotation of the rotary knob 9 is a high-speed rotation, and the process proceeds to step S106 where a check is made to determine whether or not the rotation of the rotary knob 9 is in a direction in which the sound volume is increased on the basis of the rotational direction signal Dr.

When it is determined in step S106 that the rotation of the rotary knob 9 is in a direction in which the sound volume is increased, the process proceeds to step S107 where a sound volume adjustment signal for increasing the sound volume by a factor three times greater than the unit sound volume change amount at a normal time (i.e., the minimum unit sound volume change amount Min) is generated and supplied to the sound volume adjusting circuit 3 through the I/O port 44 so that the sound volume is increased by three steps (3 dB in this example). Thereafter, the process returns to step S101 where waiting for the arrival of the next pulse PC is done.

On the other hand, when it is determined in step S106 that the rotation of the rotary knob 9 is in a direction in which the sound volume is decreased, the process proceeds to step S108 where a sound volume adjustment signal for decreasing the sound volume by a factor of seven times lower than the minimum unit sound volume change amount Min is generated and supplied to the sound volume adjusting circuit 3 through the I/O port 44 so that the sound volume is decreased by seven steps (7 dB in this example). Thereafter, the process returns to step S101 where waiting for the arrival of the next pulse PC is done.

In the above-described way, in this embodiment, when the user rotates the rotary knob 9 at a high speed, the speed of change in which the sound volume is decreased becomes two times or more as great as the speed of change in which the sound volume is increased, thus realizing a rapid decrease in the sound volume while avoiding a circumstance in which the sound volume is suddenly increased. Therefore, when the rotary knob is rotated counterclockwise with the intention of muting, it is possible to turn down the sound volume rapidly. At this time, even if the rotary knob is rotated clockwise by mistake, it is possible to avoid the situation in which the sound volume suddenly becomes high. Therefore, there is no need to separately provide a muting key.

Although in the above-described embodiment the rotational speed of the rotary knob 9 is classified into two steps of a high speed and a low speed, a still finer sound volume control is possible by classifying the rotational speed into three steps of a high speed, a medium speed and a slow speed, or more steps by setting a plurality of threshold values with respect to the pulse interval of the pulses PC and by varying the unit change amount whereby the sound volume is increased from the unit change amount whereby the sound volume is decreased according to the respective steps.

Further, the pulse encoder is not limited to a mechanical type or a rotary type, but may be an optical type or a magnetic type. Although the first embodiment describes the case of an adjustment operation of a pulse encoder type, the present invention may be applied to the case of an adjustment operation using a pair of touch switches or push switches.

Figure 5:
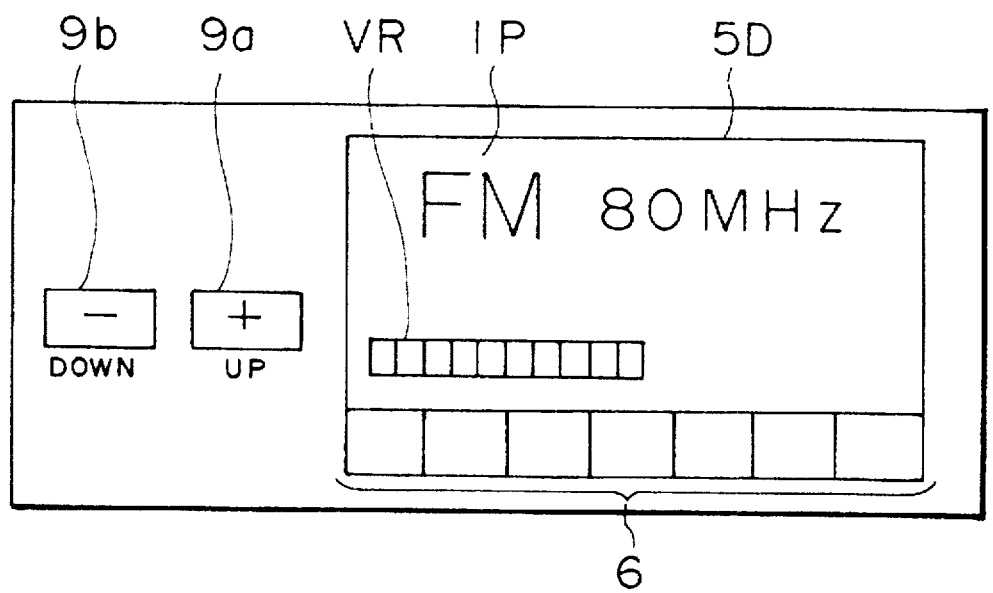
FIG. 5 shows a second embodiment of the present invention.

FIG. 5 is a front view of a preamplifier which is used in the pair of touch switches or push switches according to a second embodiment of the present invention.

Those components in FIG. 5 which are the same as those components of the first embodiment of FIG. 2 are given the same reference numerals, and hence a detailed description thereof is omitted.

In FIG. 5, an up key 9a and a down key 9b are provided side by side on the front of the preamplifier. The up key 9a and the down key 9b are mounted on the operation section of a touch switch or a push switch disposed within the housing of the preamplifier. The time during which the up key 9a or the down key 9b is pressed by the user is measured. When the pressing operation is an operation of a short time of a predetermined time or less, e.g., 1.5 sec or less, the sound volume is increased or decreased by one step, and when the pressing operation is an operation of a long time exceeding the predetermined time, the sound volume is increased or decreased continuously by two or more steps in proportion to the time. However, it is possible to change the unit change amount for the direction in which the sound volume is increased from that for the direction in which the sound volume is decreased.

The components of the second embodiment are the same as the components of the first embodiment except for a part of the adjustment operation section 7 and some of the control circuit 4, and hence a detailed description thereof is omitted.

In the above-described second embodiment also, the same effect and advantages as those of the first embodiment can be obtained.

Although the first and second embodiments describe a case in which the present invention is applied to the control of a sound volume, the present invention may be applied to the adjustment of sound quality. Further, the present invention may be applied to any adjustment operating apparatus in which adjustments for both up and down directions are made and in which the unit adjustment change amount is preferably varied depending upon the direction.

As has been described up to this point, according to the present invention, since the speed of change for two directions is varied in an adjustment operating apparatus in which adjustments for both up and down directions are made, an intended purpose can be achieved by increasing the adjustment change amount for, in particular, a direction in which a high-speed operation is required.

In particular, when an adjusting object is a sound volume, a rapid decrease in the sound volume can be realized while avoiding a situation in which the sound volume is suddenly increased by making the speed of change in which the sound volume is decreased higher than the speed of change in which the sound volume is increased. Therefore, there is no need to separately provide a muting key.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. An adjustment apparatus, comprising:

operation means having a knob for adjusting a sound volume so as to increase or decrease said sound volume by rotating said knob clockwise or counterclockwise, respectively, and for producing an adjustment change signal in proportion to a speed and a direction of rotation of said knob; and control means for generating a sound volume adjustment control signal for adjusting and controlling said sound volume in response to said adjustment change signal from said operation means, wherein said control means varies a first rate of change at which said sound volume is increased and a second rate of change at which said sound volume is decreased in accordance with said speed and said direction of rotation of said knob, and wherein said second rate of change is equal to said first rate of change when said speed of rotation is less than a predetermined speed, and wherein said second rate of change is greater than said first rate of change when said speed of rotation is greater than or equal to said predetermined speed.

2. The adjustment operating apparatus according to claim 1, wherein said operation means further comprises a pulse encoder for generating a number of pulses corresponding to said speed of rotation of said knob, and wherein said control means calculates said speed of rotation based on a time interval between two of said pulses.

3. A sound volume controller for an electronic apparatus, comprising:

a pulse encoder, including:
   a volume control knob, and
   means for generating, in response to a rotation of said knob, output pulses and a binary rotation direction signal indicating a direction of rotation of said knob, whereby a rotational speed of said knob is inversely proportional to an interval between two of said output pulses; and control means for generating a volume adjustment signal based on said rotational speed and said direction of rotation, whereby said volume adjustment signal increases the sound volume when said knob is rotated in one direction and decreases the sound volume when said knob is rotated in an opposite direction, and whereby when said rotational speed is slower than a predetermined speed the sound volume is increased at a same rate than when it is decreased, and whereby when said rotational speed is faster than said predetermined speed the sound volume is decreased at a faster rate than when it is increased.

\* \* \* \* \*